(12) United States Patent
Edgar et al.

(10) Patent No.: US 8,823,014 B2
(45) Date of Patent: Sep. 2, 2014

(54) OFF-AXIS SILICON CARBIDE SUBSTRATES

(75) Inventors: James Edgar, Manhattan, KS (US); Michael Dudley, Miller Place, NY (US); Martin Kuball, Bristol (GB); Yi Zhang, Manhattan, KS (US); Guan Wang, Worcester, MA (US); Hui Chen, Stony Brook, NY (US); Yu Zhang, Stony Brook, NY (US)

(73) Assignees: Kansas State University Research Foundation, Manhattan, KS (US); State University of New York Stony Brook, Albany, NY (US); The University of Bristol, Bristol (GB)

( * ) Notice: Subject to any disclaimer, the term of this patent is extended or adjusted under 35 U.S.C. 154(b) by 648 days.

(21) Appl. No.: 12/966,753

(22) Filed: Dec. 13, 2010

(65) Prior Publication Data

US 2011/0220915 A1    Sep. 15, 2011

Related U.S. Application Data

(63) Continuation-in-part of application No. PCT/US2009/047373, filed on Jun. 15, 2009.

(60) Provisional application No. 61/061,524, filed on Jun. 13, 2008, provisional application No. 61/321,446, filed on Apr. 6, 2010.

(51) Int. Cl.
*H01L 29/04*    (2006.01)

(52) U.S. Cl.
USPC ...... 257/77; 257/628; 257/E29.004; 438/478; 438/931

(58) Field of Classification Search
USPC ........................................... 257/628
See application file for complete search history.

(56) References Cited

U.S. PATENT DOCUMENTS

| 5,363,800 | A | * | 11/1994 | Larkin et al. | 438/507 |
| 6,165,874 | A | * | 12/2000 | Powell et al. | 438/478 |
| 6,559,518 | B1 | * | 5/2003 | Niwa | 257/632 |
| 6,734,530 | B2 | * | 5/2004 | Ban | 257/628 |
| 8,378,463 | B2 | * | 2/2013 | Brandes et al. | 257/627 |
| 2004/0094773 | A1 | * | 5/2004 | Kiyoku et al. | 257/103 |
| 2009/0230404 | A1 | * | 9/2009 | Masuda et al. | 257/77 |

* cited by examiner

*Primary Examiner* — Stephen W Smoot
(74) *Attorney, Agent, or Firm* — Lathrop & Gage LLP

(57) ABSTRACT

A method of epitaxial growth of a material on a crystalline substrate includes selecting a substrate having a crystal plane that includes a plurality of terraces with step risers that join adjacent terraces. Each terrace of the plurality or terraces presents a lattice constant that substantially matches a lattice constant of the material, and each step riser presents a step height and offset that is consistent with portions of the material nucleating on adjacent terraces being in substantial crystalline match at the step riser. The method also includes preparing a substrate by exposing the crystal plane; and epitaxially growing the material on the substrate such that the portions of the material nucleating on adjacent terraces merge into a single crystal lattice without defects at the step risers.

20 Claims, 9 Drawing Sheets

15R

45R

60R

25H

48R

21H

78R

42R

19H

72R

OFF-AXIS SILICON CARBIDE SUBSTRATES

CROSS-REFERENCE TO RELATED APPLICATIONS

This application is a continuation-in-part of International Patent Application No. PCT/US2009/047373, filed Jun. 15, 2009, which claims the benefit of priority to U.S. Provisional Application No. 61/061,524 filed Jun. 13, 2008. This application also claims the benefit of priority to U.S. Provisional Application No. 61/321,446, filed Apr. 6, 2010. The above-identified patent applications are incorporated by reference herein in their entireties.

STATEMENT REGARDING FEDERALLY-SPONSORED RESEARCH

Certain research included in this application was funded by the National Science Foundation Materials World Network Program under Grant No. 0602875 and by the Engineering and Physical Science Research Council (EPSRC) under Grant No. EP/D075033/1 under the NSF-EPSRC Joint Materials Program. Some testing was carried out at the Brookhaven National Laboratory (BNL), which is supported by the U.S. Department of Energy (D.O.E.) under Grant No. DE-AC02-76CH00016. Other research was conducted at the Center for Functional Nanomaterials, BNL, which is supported by the U.S. Department of Energy, Division of Materials Sciences and Division of Chemical Sciences, under Contract No. DE-AC02-98CH10886.

BACKGROUND OF THE INVENTION

1. Field of the Invention

The invention relates generally to methods of fabricating material structures on a substrate, including for example homostructures and/or heterostructures. More specifically, the invention relates to the field of providing a substrate for epitaxial growth of films for device fabrication.

2. Description of the Related Art

Products such as semiconductor devices are often fabricated in an epitaxial layer of a crystalline semiconductor material grown on a substrate crystal. FIG. 1A shows a perspective view of a semiconductor wafer 10 with devices 20 fabricated in an epitaxial layer (only representative devices 20 are labeled in FIG. 1A, for clarity of illustration). A cross-sectional view of a portion A in FIG. 1A, is shown in FIG. 1B. Wafer 10 includes a substrate 12 and epitaxial layer 14. A cross-sectional view of a portion B in FIG. 1B, is shown in FIG. 1C. Substrate 12 is seen as composed of crystalline units 11, while epitaxial layer 14 is seen as composed of crystalline units 13 that stack with the crystal matrix of substrate 12 (only representative crystalline units 11 and 13 are labeled in FIG. 1C, for clarity of illustration). The combination of an epitaxial layer on a substrate is sometimes referred to as a "material structure" herein. It should be mentioned here that the crystalline units may be single atoms or repeating molecular units, and that the number of layers and type of stacking shown are for illustration only (for example, a material structure may be a homostructure or a heterostructure as these terms are known in the art). Actual substrates, epitaxial layer materials, thicknesses and growth parameters will vary according to design of a final, fabricated product.

3. Crystallography Background Information

FIG. 2 shows a unit cell 32 of a crystalline structure with a variety of planes thereof illustrated and designated in terms of basic Miller indices, which are a standard form of notation in crystallography to designate particular planes of a crystal. Each of three indices x, y and z indicate a direction that is normal to the designated plane, relative to the Cartesian coordinate system x, y, z as shown. For example, plane 34 is an (001) plane, plane 36 is a (100) plane, plane 38 is an (010) plane, plane 40 is a (101) plane, planes 42 are (111) planes, and planes 44 are (1 −1 1) planes. It is conventional to utilize a bar over a Miller index to denote a negative number, and such notation is utilized in the drawings herein, but minus signs are utilized in the text of this specification to show negative numbers, to avoid errors in published documents. Also, by convention, adjacent numerals denote Miller indices when each index is a single digit, but dots are utilized as separators herein when any such index exceeds a value of 9 (e.g., (11•8•11) as seen below).

Unit cell 32 is shown as having simple cubic symmetry (e.g., a lattice constant that is the same in each of the x, y, and z directions). It is convenient, however, when discussing materials having hexagonal structure to utilize a related, four-index Bravais-Miller notation. In Bravais-Miller notation, the y index is essentially rotated relative to its Cartesian equivalent, to follow one of the crystal directions, and a redundant index i is formed from the x and y indices, with i=−x−y. FIG. 3 illustrates the coordinate system of Bravais-Miller notation. Bravais-Miller notation places i after x and y, but before z; therefore, for example, planes denoted as (1 −1 0) and (1 1 0) become (1 −1 0 0) and (1 1 −2 0), respectively, in Bravais-Miller notation. It is therefore understood that three-index notation herein is simple Miller notation while four-index notation is Bravais-Miller notation.

4. Background Information of Silicon Carbide

Silicon Carbide, SiC, is a well known crystalline material that exhibits polytypism, that is, it exists in a variety of crystalline forms that differ in physical arrangement without varying in stoichiometry. SiC that forms a cubic lattice structure is generally designated as β-SiC while SiC that forms either a hexagonal or a rhombohedral structure is generally designated as α-SiC. Each polytype of SiC includes double layers of silicon and carbon atoms tetragonally bonded, such layers can stack relative to one another in three ways to form planes commonly referred to as A, B and C planes.

Another form of notation often applied to SiC polytypes indicates the specific crystalline type and number of layers in a repeating structure of the crystal. The crystalline types are designated as H (hexagonal), C (cubic) or R (rhombohedral). Three of the most common polytypes are the 3C—SiC, 4H—SiC and 6H—SiC polytypes. A 15R—SiC polytype is also relatively common, but has traditionally been viewed as an unusable byproduct of 4H—SiC or 6H—SiC crystal production. Not only has 15R—SiC historically been viewed as useless, significant efforts have been made to prevent its formation during processing.

5. Background Information of Beta Cells and Icosahedral Boron Arsenide (IBA)

Beta cells are known examples of semiconductor devices that may be fabricated utilizing epitaxial layers. Beta cells are capable of the direct conversion of nuclear into electrical energy. The beta cell receives beta particles emitted by some source of radioactive energy; the beta particles excite electron-hole pairs that are separated by an electric field across the semiconductor junction. This creates current that can be used as a source of electrical power. Unlike common batteries or other chemical-based energy sources, beta cells may last a considerable amount of time (e.g., corresponding to a half-life of the radioactive source, often decades or more) making them ideal for situations where a long-term power source is needed or battery changing is impractical, such as in heart pacemakers, satellites, and other electrical systems.

Silicon-based beta cells have been developed, but such beta cells degrade relatively quickly due to radiation damage. Because of this, alternative materials were investigated. Icosahedral boron arsenide $B_{12}As_2$ (IBA) is a wide band gap semiconductor (3.47 eV) with the extraordinary ability to "self-heal" radiation damage, making it an attractive choice. See, e.g., U.S. Pat. No. 6,749,919 issued to Aselage et al. IBA is a member of the icosahedral borides family, which also includes boron carbide, alpha-boron, and icosahedral boron phosphide. IBA may be epitaxially grown on a substrate for use in beta cells, and the lattice constant of IBA is a close enough match to that of SiC (that is, the IBA lattice constants match appropriate multiples of the SiC lattice constant, as discussed below) to consider SiC as an appropriate substrate for IBA growth.

In addition to possible uses as beta cells, IBA also shows promise for use in other applications where it is desirable to obtain an electrical signal from neutrons emitted from radioactive sources such as a neutron detector. Neutron detectors are useful as an indicator of the presence of radioactive materials, e.g., for security or regulatory compliance purposes. Another potential application of IBA is in thermoelectric converters.

SUMMARY

A method of epitaxial growth of a material on a crystalline substrate includes selecting a substrate having a crystal plane that includes a plurality of terraces with step risers that join adjacent terraces. Each terrace of the plurality or terraces presents a lattice constant that substantially matches a lattice constant of the material, and each step riser presents a step height and offset that is consistent with portions of the material nucleating on adjacent terraces being in substantial crystalline match at the step riser. The method also includes preparing a substrate by exposing the crystal plane; and epitaxially growing the material on the substrate such that the portions of the material nucleating on adjacent terraces merge into a single crystal lattice without defects at the step risers.

A material structure includes a substrate having a crystal plane that includes a first terrace and a second terrace, a step riser between the first and second terraces. Each of the first and second terraces presents a lattice constant that substantially matches a lattice constant of the material, and each step riser presents a step height and offset consistent with portions of the material nucleating on adjacent terraces being in substantial crystalline match at the step riser. The material structure also includes an epitaxially grown material on the substrate that forms portions of the material as a single crystal lattice upon each terrace, that join as a single crystal over the step risers, without defects associated with the step risers.

A material structure includes an icosahedral boride material deposited on an m-plane substrate selected from the group of substrates consisting of: 15R—SiC, 45R—SiC, 60R—SiC, 25H—SiC, 48R—SiC, 21H—SiC, and 78R—SiC.

A method of making a material structure includes employing epitaxial layers of materials, reducing in-plane twinning and translational variants using a substrate selected from a group consisting of: 15R—SiC, 45R—SiC, 60R—SiC, 25H—SiC, 48R—SiC, 21H—SiC, and 78R—SiC; and preparing the substrate with m-plane orientation surfaces.

BRIEF DESCRIPTION OF THE SEVERAL VIEWS OF THE DRAWINGS

Illustrative embodiments of the present invention are described in detail below with reference to the attached drawing figures, which are incorporated by reference herein and wherein.

DETAILED DESCRIPTION

1. Overview of the Invention

Figure 1A:
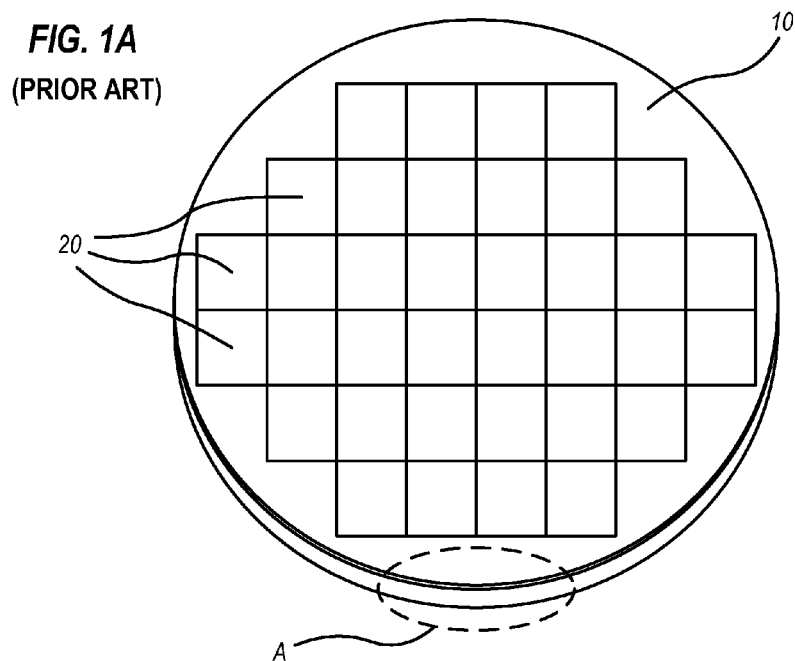
FIG. 1A shows a wafer with semiconductor devices fabricated thereon.
Figure 1B:
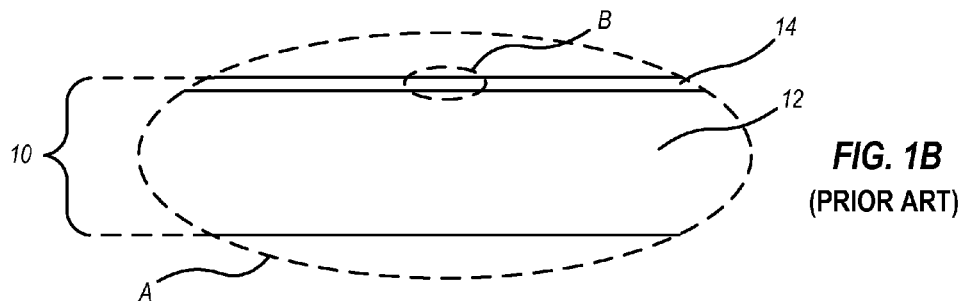
FIG. 1B is a detailed cross-sectional view of a portion of the wafer of FIG. 1A.
Figure 1C:
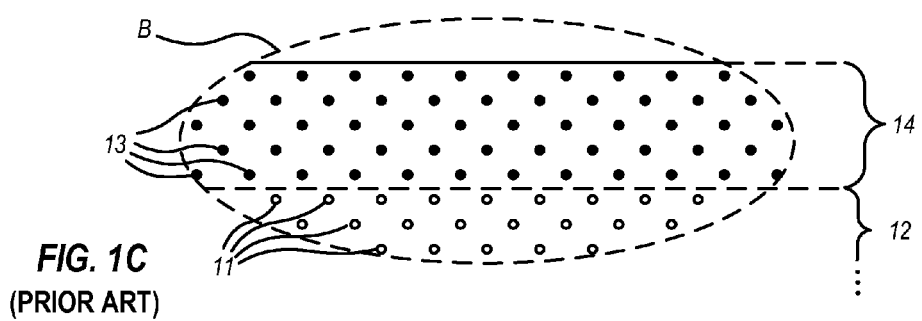
FIG. 1C is a further detailed cross-sectional view of a portion of the wafer of FIG. 1A.
Figure 2:
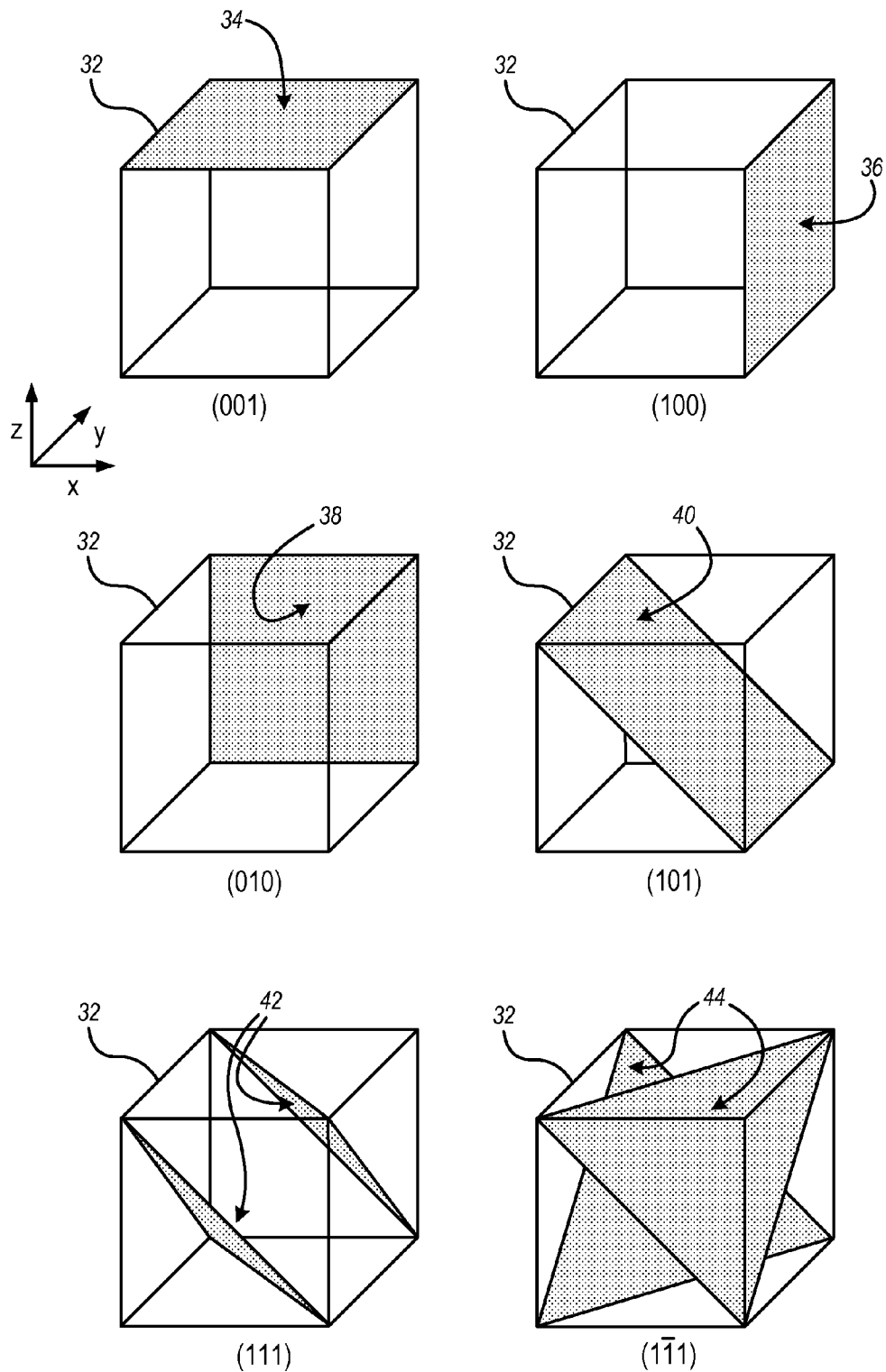
FIG. 2 shows a unit cell of a crystalline structure with planes thereof designated in terms of basic Miller indices.

Embodiments of the present invention provide improved semiconductor material structures and devices, as well as methods for making those material structures and devices.

Disclosed is the discovery that the use of certain single crystal planes as substrates results in better quality epitaxial layers by eliminating defects such as rotational twins and translational variants. Epitaxial layers grown as disclosed herein may have reduced leakage currents, improved carrier lifetimes and other benefits that improve performance of electronic and optoelectronic devices fabricated therein. Initial work by the inventors in this application showed that use of m-plane (1 –1 0 0) 15R—SiC as an epitaxial growth substrate generated high quality IBA grown thereon. This is but an example of selecting a substrate that presents a plurality of terraces with step risers therebetween, each of which substantially matches lattice constants of a film grown thereon such that independently nucleated portions of the film naturally grow together without twinning defects. However, 15R—SiC is not presently commercially available as a high quality substrate in significant quantities.

New results, discussed further below, demonstrate that appropriate step risers to eliminate defects can be also achieved using the 4H—SiC polytype of silicon carbide that is commercially available.

As utilized herein in the context of lattice constants, "substantially matches" means that effective lattice constants of a film and a substrate are consistent with the ability to grow a stable form of the film on the substrate. It is well known in the art of epitaxy that a perfect lattice match is not necessary for such growth, so effective lattice constants on the order of up to about 15% mismatch may be considered to "substantially match" one another in most cases, however individual material systems may tolerate more or less mismatch than 15%. Furthermore, when reference is made to offsets or step heights in a substrate "substantially matching" lattice constants of a film grown thereon, it is understood that the term applies as needed to multiples of lattice constants as necessary. For example, a step height might be said to "substantially match" if the height substantially matches double, triple or other integral multiple of a lattice constant of the film. Similarly, IBA "matches" the SiC lattice constants in that a single IBA lattice constant in that the IBA lattice constant substantially matches double the SiC lattice constant (see, e.g., FIG. 7 below). Similarly, a "substantial crystalline match" is utilized herein to mean that crystalline portions that initially nucleate and grow independently of one another are identical in orientation, and close enough to matching juxtaposition with one another, that they grow together into a unified single crystal without forming defects where they join.

2. IBA Growth on m-Plane (1 −1 0 0) 15R—SiC

IBA is based on twelve-boron-atom icosahedra, which reside at the corners of an α-rhombohedral unit cell, and two-atom As—As chains lying along the rhombohedral axis. In the absence of native substrates, IBA has been heteroepitaxially grown on substrates with compatible structural parameters. For example, until recently, this has been attempted on substrates with higher symmetry than IBA, such as Si and 6H—SiC. Unfortunately, growth of a lower symmetry epilayer on a higher symmetry substrate often produces structural variants, a phenomenon known as degenerate epitaxy. The lower symmetry epilayer may nucleate in different areas in different orientations (for example, as mirror images of one another) such that where the separately-nucleated crystals grow together, double positioning boundary defects ("DPBs") or "twinning" defects form. DPBs have a detrimental effect on device performance in that they form electrical leakage paths that have severely hindered progress of this new material to date. An enumeration of these variants can be obtained by analysis of the 2D point groups of the substrate surface and the epilayer surface. For the case of IBA grown on Si with (100), (110) and (111) orientation and (0001) 6H—SiC, rotational and translational variants are both predicted and observed.

Embodiments herein, however, defeat the effects of degenerate epitaxy by choosing substrates for which no variants are predicted, or by forcing growth to occur as a single one of the variants. For example, single terrace, m-plane 15R—SiC fulfills this requirement for IBA. In one embodiment herein, IBA grown on m-plane 15R—SiC was found to be free from structural variants and to be of high single crystalline quality, offering potential for future device applications. The reasons for the high single crystalline quality have been subsequently determined and are given below.

Interestingly, 15R—SiC as well as its related polytypes have traditionally been viewed as unusable byproducts of 4H—SiC or 6H—SiC crystal production. Not only has 15R—SiC historically been viewed as useless, significant efforts have been made to prevent its formation during processing. Thus, the utilities disclosed herein are contrary to most conventional expectations.

IBA was deposited using chemical vapor deposition (CVD) onto m-plane 15R—SiC at 1200° C. and 500 Torr of reactor pressure for 1 hour, using 1% $B_2H_6$ in $H_2$ and 2% $AsH_3$ in $H_2$ as sources. The epitaxial IBA film had a nominal thickness of 3 μm. As large scale 15R—SiC substrates are presently not readily available, a commercial m-plane 6H—SiC substrate was used, which contained 15R—SiC inclusions of about 300-500 μm diameter. The film/substrate orientations were determined by synchrotron white beam x-ray topography (SWBXT). Raman spectroscopy analysis of the films using a Renishaw InVia micro-Raman system with 488 nm laser excitation provided information on the SiC polytype and the relative quality of the IBA. The interfaces between the IBA and the SiC were examined by high-resolution transmission electron microscopy (HRTEM) using a 300 keV JEOL 3000EX system at Brookhaven National Laboratory.

Figure 4:
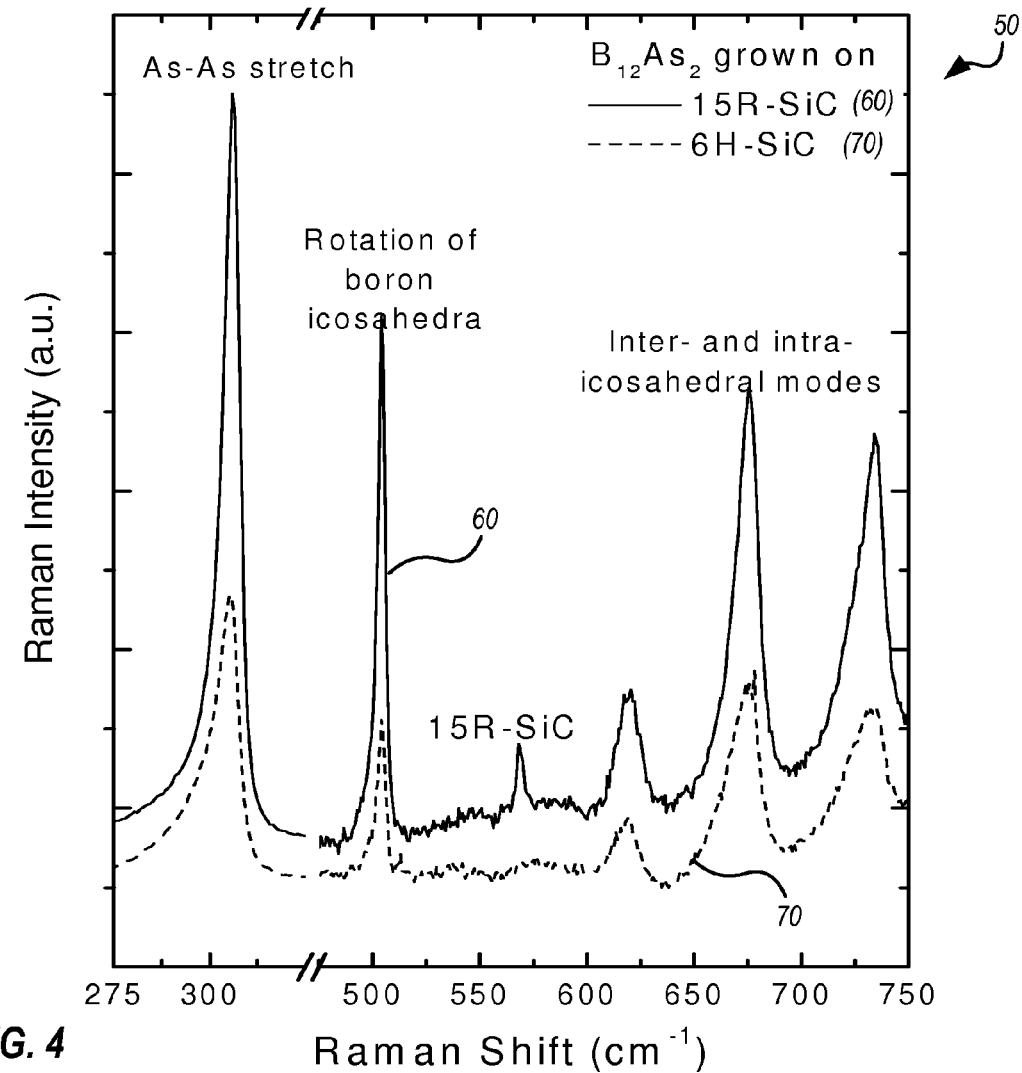
FIG. 4 shows a plot of Raman spectra recorded from IBA grown on m-plane 15R— and 6H—SiC, in accord with an embodiment.

SWBXT Laue patterns recorded from an IBA film on m-plane 15R—SiC provided global determination that the film was single crystal of (353) orientation and twin free. This constitutes a significant improvement over films grown under identical conditions on m-plane 6H—SiC. FIG. 4 shows a plot 50 of Raman spectra 60 and 70, recorded from IBA grown on m-plane 15R— and 6H—SiC respectively, which confirm this improvement. Labeled within plot 50 are Raman shift regions corresponding to As—As stretching, rotation of boron icosahedra, and inter- and intra-icosahedral modes; also, though there are no 6H—SiC substrate modes in the spectral range shown, one 15R—SiC mode exists. Raman linewidth is narrower at a given intensity for the IBA film grown on 15R—SiC, and in particular Raman intensity is significantly stronger than that of the IBA film grown on 6H—SiC, despite both films having similar thickness. This illustrates that phonon properties, which are significant predictors of other macroscopic properties of the film, are improved.

Figure 5:
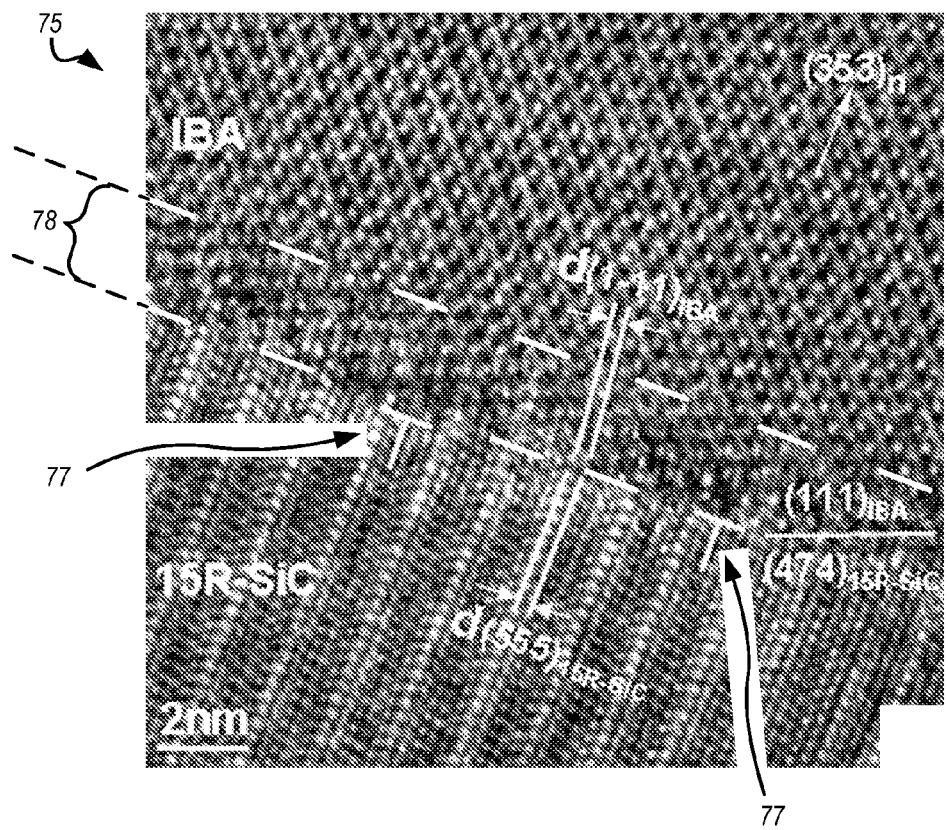
FIG. 5 shows HRTEM images showing a sharp IBA/15R—SiC interface and the (353) surface orientation of IBA, in accord with an embodiment.

Excellent crystal quality was further confirmed using HRTEM. FIG. 5 shows a HRTEM image 75 recorded along the [1 0 −1] zone axis (parallel to [1 1 −2 0] in the hexagonal system) showing an IBA/15R—SiC interface and the (353) surface orientation of IBA. T-shaped symbols 77 mark the location of interfacial dislocations with extra half-planes in the 15R—SiC substrate. As can be seen from FIG. 5, the 15R—SiC substrate shows a relatively clean interface and no twins in the grown IBA film, in contrast to results from m-plane 6H—SiC. There appears to be a region 78 of about 2-3 nm width in the IBA adjacent to the 15R—SiC interface (set off by widely spaced lines) that is less regular than the IBA further from the 15R—SiC interface; it is believed that the IBA in this region is strained by a slight mismatch with the 15R—SiC substrate whereas the IBA further from the interface exhibits an unstrained IBA lattice structure.

Figure 6:
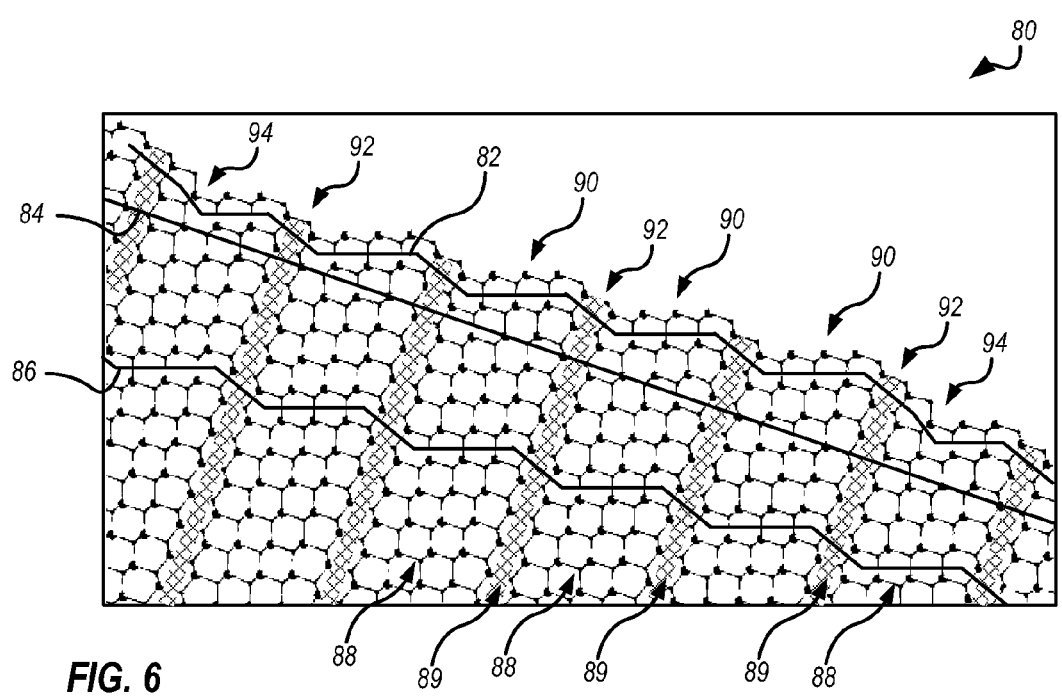
FIG. 6 is a cross-sectional crystal schematic of the 15R—SiC structure, in accord with an embodiment.

Structural correspondence was confirmed using multislice simulation and the lattice orientation observed is consistent with (353) film orientation. This can be seen in FIG. 6, which is a cross-sectional crystal schematic 80 along [1 0 −1] of the 15R—SiC structure. An uppermost black line 82 traverses an on-axis, facet configuration of close-packed (474) atomic terraces 90, and coupled (212) and (11•8•11) step risers 92 and 94 respectively (not all terraces 90 or risers 92 or 94 are labeled within FIG. 6, for clarity of illustration). A middle black line 84 indicates the theoretical (i.e., unfaceted) m-plane itself, and a lower black line 86 indicates the surface comprising only (474) and (212) facets—which results in a 3° misorientation from m-plane. FIG. 6 also shows regions that may be thought of as lamellar nano-domains of 3C—SiC structure bounded by the (474) facets are shown as regions 88, and shaded domain boundaries parallel to the (111) plane ((0001) in hexagonal system) as cross hatched regions 89.

3. Explanation of Twin-Free IBA Growth in Context of Substrate Properties

Referring still to FIG. 6, a single m-plane terrace of the 15R—SiC substrate surface (e.g., line 84) exhibits a 2D point group m, while that of the (353) IBA is also m, so that no structural variants are predicted, in agreement with the observed absence of twins. However, the 15R—SiC substrate surface, hydrogen etched prior to growth, is expected to display a faceted structure featuring alternating close-packed (474) and (212) facets that are three and two bilayers wide, respectively, analogous to the behavior observed in m-plane 6H—SiC. Therefore, why IBA growth on 15R—SiC is single-crystalline and non-twinned needs further explanation.

Figure 3:
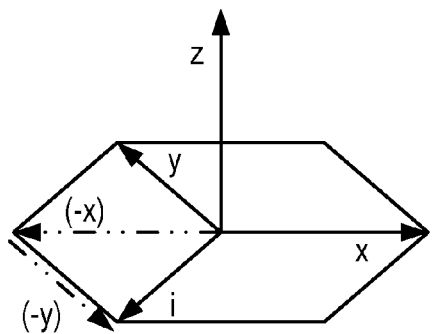
FIG. 3 illustrates the coordinate system of Bravais-Miller notation.

If the substrate surface was exclusively composed of (474) and (212) facets, the asymmetry in the widths of such facets would result in a ~3° offset from m-plane orientation (e.g., see FIG. 3, line 86). The periodic appearance of (11•8•11) facets would compensate for this asymmetry and produce an "on-axis" surface, as shown in FIG. 3 (upper line). This latter surface can be considered as quasi-vicinal with the (474) facets forming terraces 90 and the other facets as step risers 92 and 94. The stacking sequence below each terrace 90 is identical so as to expose a series of equal thickness, lamellar nano-domains of 3C (cubic) structure leading to identical nucleation possibilities. This therefore breaks the symmetry of the m-plane surface and would seem to eliminate the associated advantage for IBA growth; that is, it suggests that roughly half of the terraces 90 should nucleate IBA in one orientation and the other half in the other orientation, leading to a high density of twinning defects. In order to understand why the IBA adopts a highly crystalline, non-twinned configuration on this substrate, it is instructive to consider the details of the substrate and IBA structures and in particular the dangling bond configurations exhibited at the interface.

Figure 7:
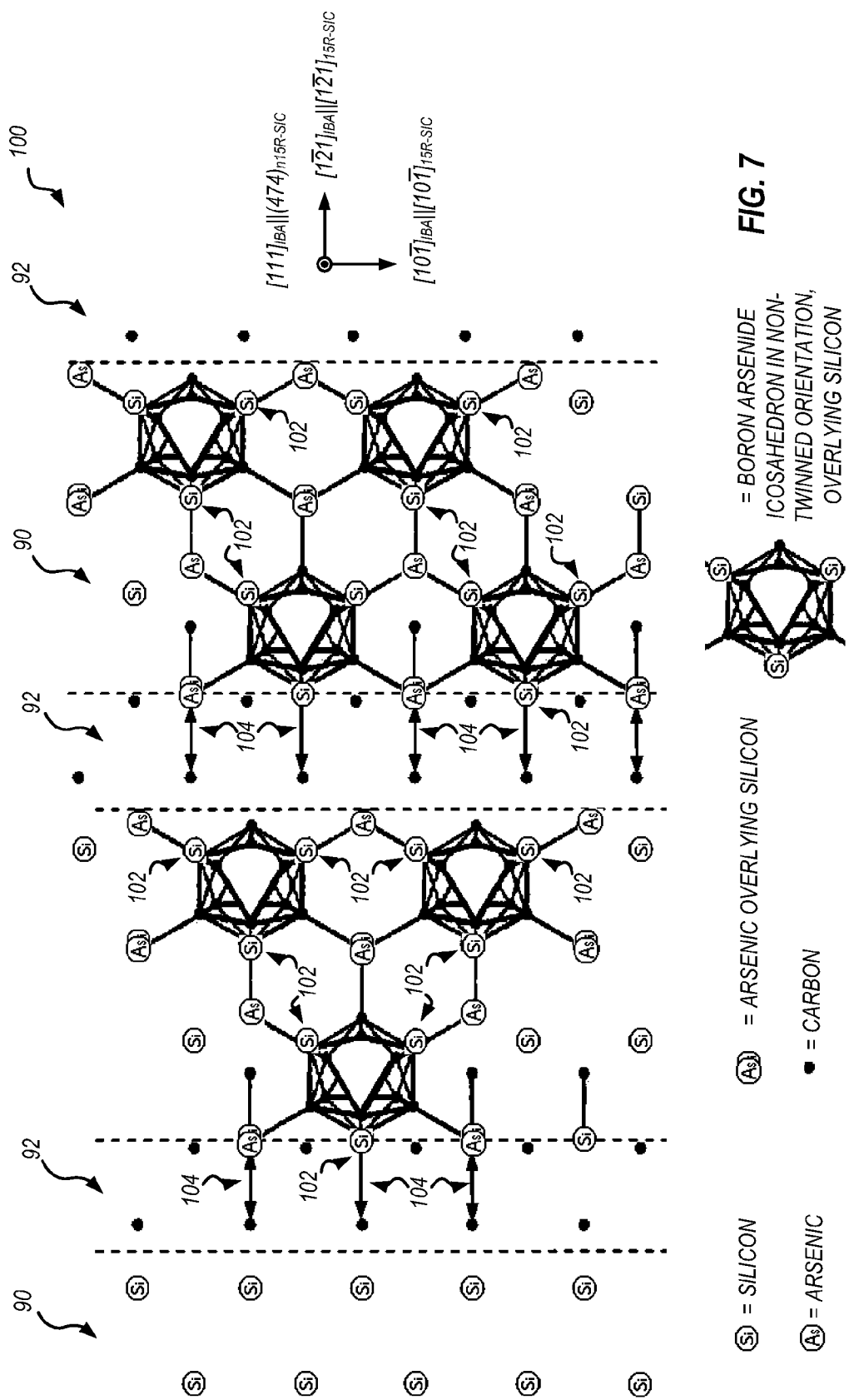
FIG. 7 shows a plan view of IBA in a non-twinned, (353) orientation nucleated on m-plane 15R—SiC terraces, in accord with an embodiment.
Figure 8:
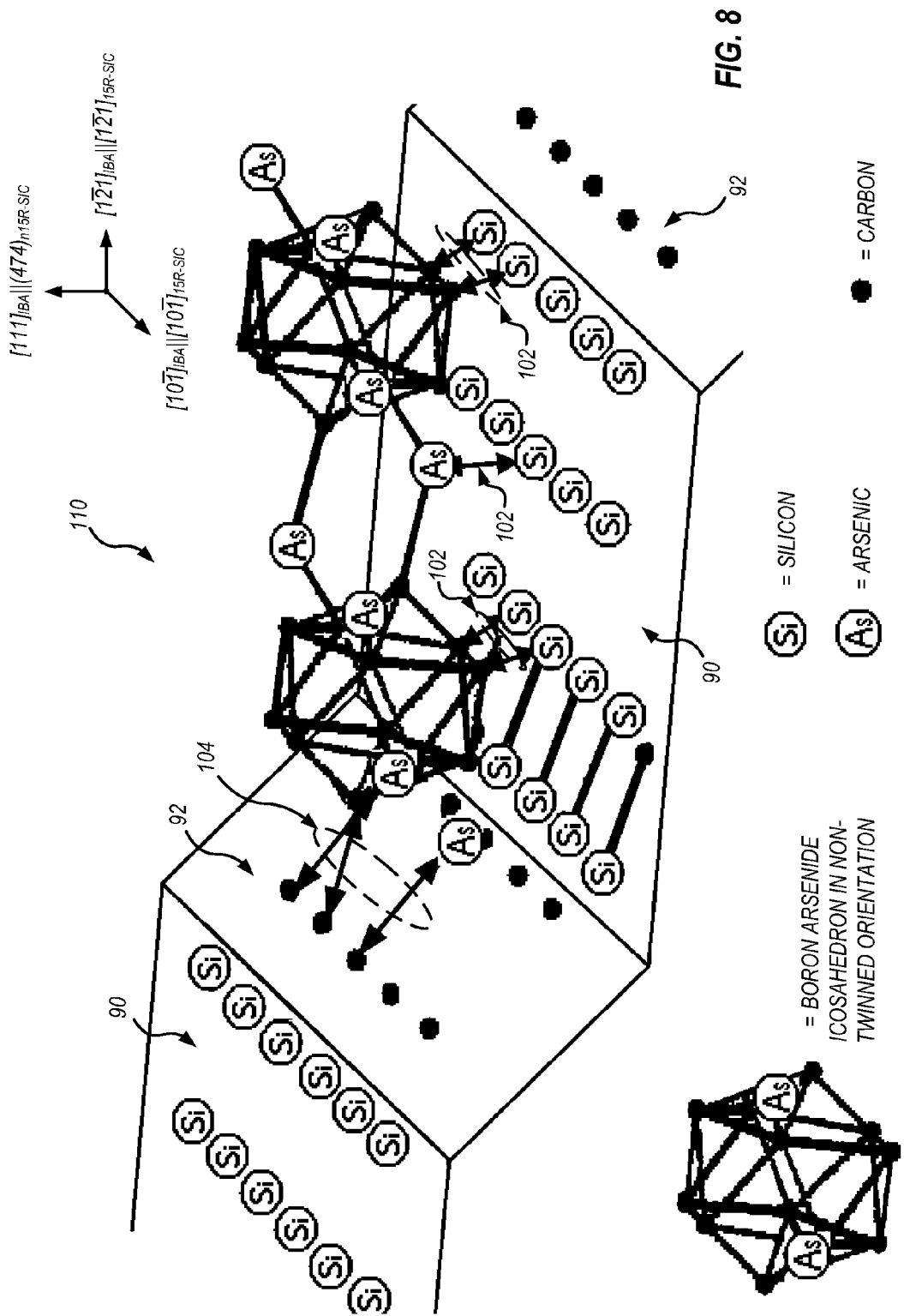
FIG. 8 shows a perspective view of IBA in a non-twinned, (353) orientation nucleated on m-plane 15R—SiC terraces, in accord with an embodiment.

FIG. 7 shows a plan view 100, and FIG. 8 shows a perspective view 110, of IBA in a non-twinned, (353) orientation nucleated on m-plane 15R—SiC terraces 90 (which are also shown in FIG. 6). Si and As atoms in views 100 and 110 are labeled, while C atoms are shown as large dots. IBA icosahedra in a non-twinned orientation are also shown. Triangular configurations of B atoms at the bottoms of IBA icosahedra bond to similarly oriented triangular configurations of Si atoms exposed on the (474) 15R—SiC terraces 90, at locations 102. In addition, As and B atoms are well bonded to carbon atoms on each neighboring (212) 15R—SiC step riser 92, at locations 104 (not all bonding locations 102 and 104 are labeled in FIGS. 7 and 8, for clarity of illustration). It can be seen that each of the (474) terraces and associated (212) step riser form a spacing of twice the lattice constant of the IBA in a transverse direction of the terrace, that is, a direction leading across each terrace to the adjacent step risers (across the page in FIG. 7 and FIG. 8, not in and out of the page). Furthermore, the step risers present a step height and offset that are consistent with the non-twinned IBA that nucleates on one riser being in substantial crystalline match with the non-twinned IBA that nucleates on an adjacent riser. That is, portions of IBA that nucleate on adjacent terraces will be of identical type, orientation and relative spacing such that the IBA merges into a single crystal lattice without any defect associated with the step riser therebetween.

Figure 9:
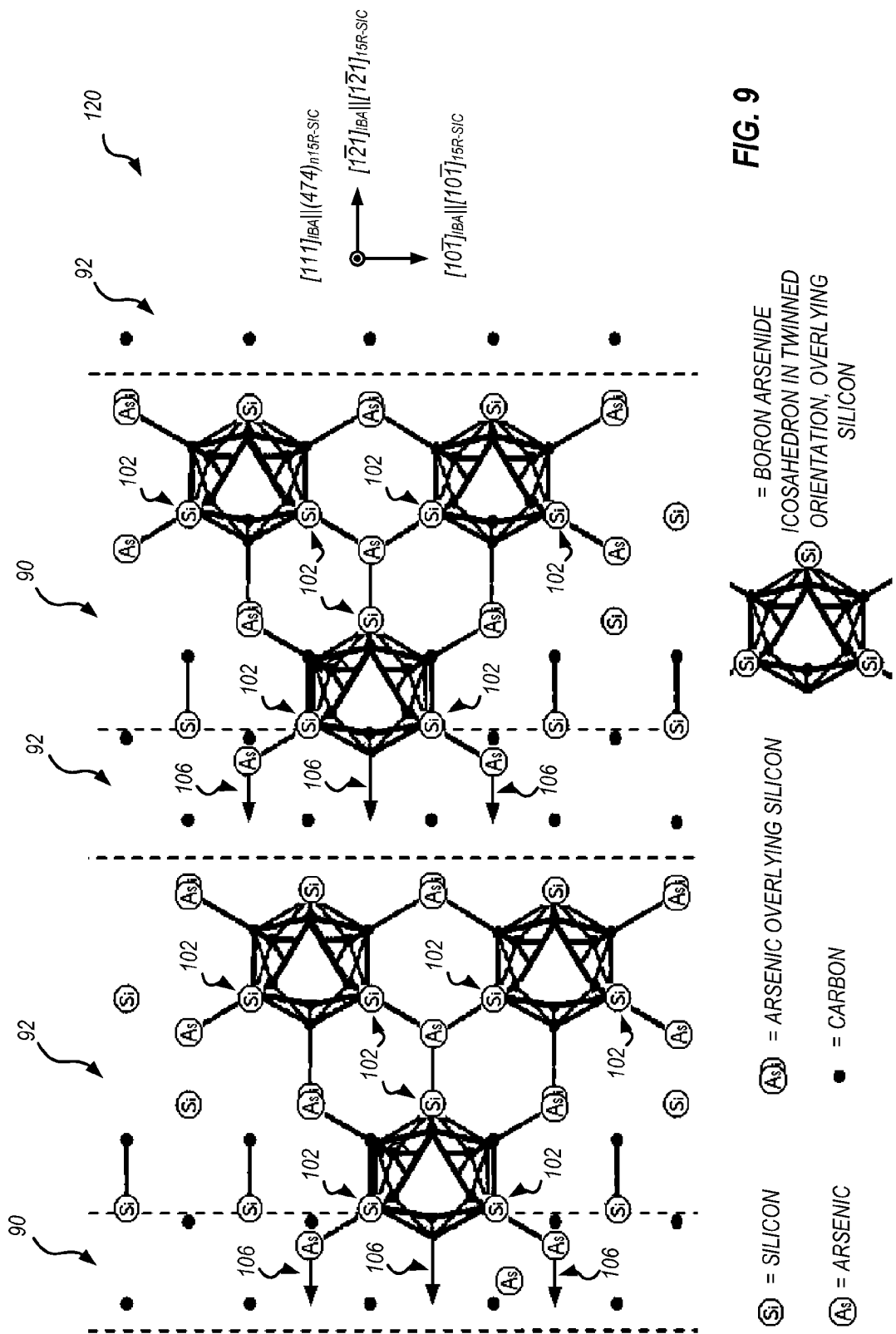
FIG. 9 shows a plan view of IBA in a twinned, (353) orientation adjacent to m-plane 15R—SiC terraces.
Figure 10:
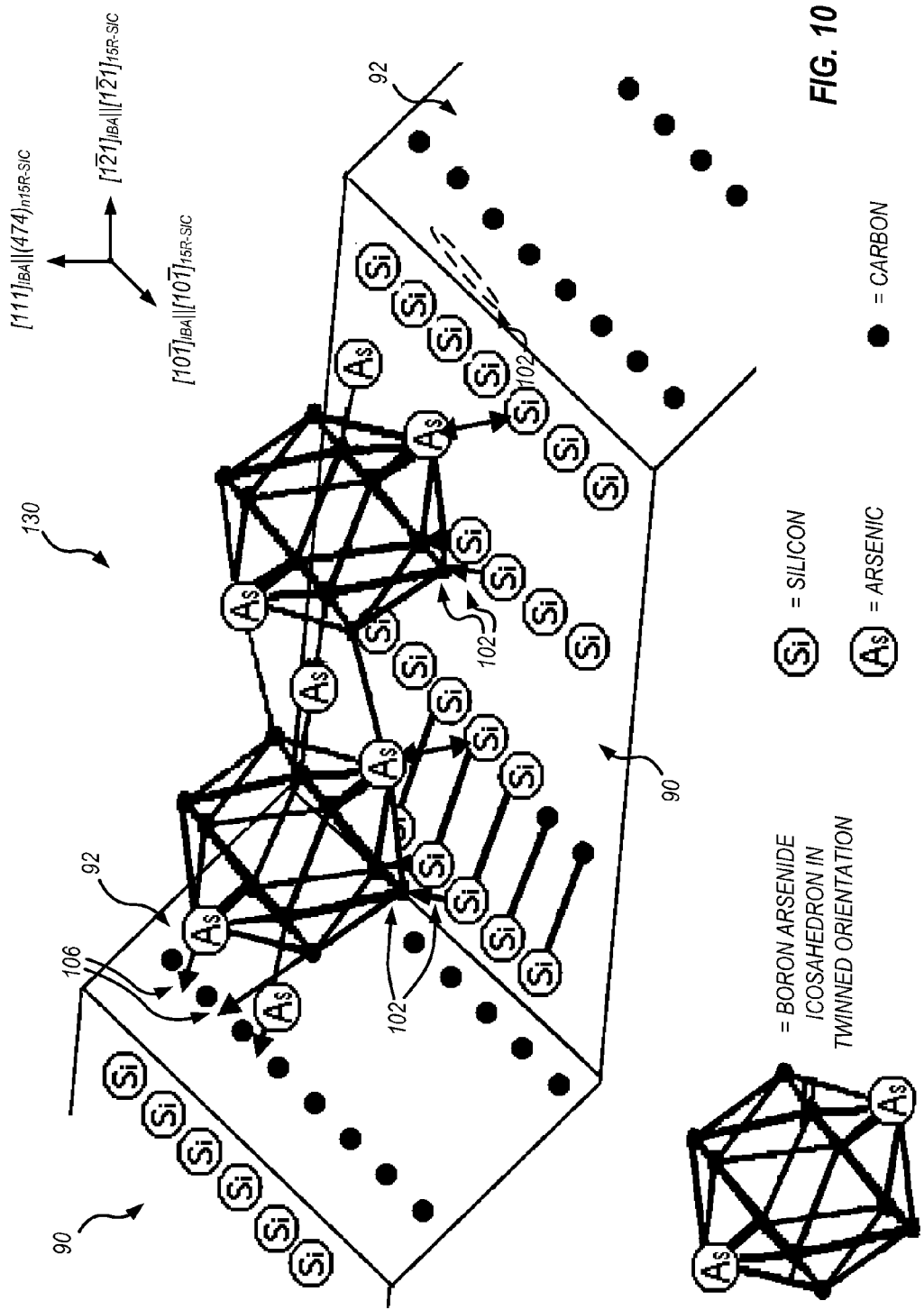
FIG. 10 shows a perspective view of IBA in a twinned, (353) orientation adjacent to m-plane 15R—SiC terraces.

FIG. 9 shows a plan view 120, and FIG. 10 shows a perspective view 130, of IBA in a twinned, (353) orientation, adjacent to and as if nucleated on m-plane 15R—SiC terraces 90 (which are also shown in FIG. 6). Si and As atoms in views 100 and 110 are labeled, while C atoms are shown as large dots. IBA icosahedra in a twinned orientation are also shown. As is the case for the non-twinned IBA shown in FIGS. 7 and 8, triangular configurations of B atoms at the bottoms of IBA icosahedra bond to similarly oriented triangular configurations of Si atoms exposed on the (474) 15R—SiC terraces 90, at locations 102 (not all bonding locations 102 are labeled in FIGS. 9 and 10, for clarity of illustration). However, in contrast with the non-twinned orientation, As and B atoms of the twinned orientation at step risers 102 are not able to reasonably bond to C atoms on the neighboring (212) 15R—SiC step riser 92. This is shown at locations 106, wherein (hypothetical) bonds that start with the appropriate As and B atoms of the twinned orientation do not lead to an appropriate C atom.

Straightforward consideration of lattice geometry reveals that if IBA nucleates on either the broader (474) 15R—SiC terraces 90 or the narrower (212) 15R—SiC step risers 92 with the (111) IBA planes aligned to the respective facets, the IBA film will adopt (353) IBA orientation, in agreement with observations—although if nucleation occurs simultaneously on both types of facet, the film would be polycrystalline. However, the large dimension of the in-plane repeat unit of the (111) IBA (e.g., twice that of the close-packed SiC planes) requires that a facet width be large enough to accommodate nuclei of IBA which are at least two icosahedra wide (e.g., see FIGS. 7 and 8), so preferential nucleation on the broader (474) 15R—SiC terraces 90 is expected. Additional stabilization for nucleation on the (474) 15R—SiC terraces 90 in the non-twinned orientation is provided by the fact that the IBA is able to simultaneously bond to one (474) 15R—SiC terrace 90 and an adjacent (212) 15R—SiC step riser 92, as shown in FIGS. 7 and 8. In contrast, such stabilization is absent for IBA nuclei in twinned orientation, because bonding does not occur at step risers 92, thus preventing nucleation of twins (see also FIGS. 9 and 10). That is, the (212) 15R—SiC step risers 92 energetically favor IBA nucleation in a single, and therefore non-twinned, crystal orientation. Therefore, the choice of (353) IBA orientation is dominated by the tendency to nucleate in (111) IBA orientation on close-packed substrate facets of sufficient breadth.

Once IBA has nucleated on the m-plane SiC substrate, epitaxial growth proceeds via step flow whereby portions of IBA nucleated on one facet overgrow portions nucleated on the facet below, with the two portions being in substantial crystalline match, the step riser therebetween presenting a step height and offset consistent with the portions merging into a single IBA crystal. This is possible since the spacing of the (111) IBA planes is within 15% of the height difference between adjacent (474) 15R—SiC facets. Further accommodation of this 15% out-of-plane disregistry is provided by the periodic presence of the deeper step riser comprising the coupled (212) 15R—SiC and (11•8•11) 15R—SiC facets. The in-plane lattice mismatch (~3.7%) is easily accommodated by the periodic appearance of interfacial dislocations (with one extra (555) half-plane on the SiC side). Thus, both in-plane and out-of-plane mismatch is accommodated, so the lattice constants are considered to substantially match and adjacent portions are in substantial crystalline match with one another. For monolayer IBA nucleated on adjacent (474) 15R—SiC terraces, there is a small mutual sideways disregistry along the terrace of ¼[1 0 −1] IBA (equivalent to ¹⁄₁₂[1 1 −2 0] IBA in the hexagonal system). This is small enough that it is accommodated elastically. For example, perfect registry will be attained if successive layers displace in opposite directions by ⅛[1 0 −1] IBA. Partial nucleation on the narrower (474) 15R—SiC facet just below the deeper step riser facilitates the overgrowth process between nuclei originating on the two broader (474) 15R—SiC facets just above and below this narrower (474) 15R—SiC facet. In this way, the IBA is able to quickly self-adjust its structure near the film/substrate interface while maintaining good bonding with the substrate, allowing it to subsequently grow with nearly perfect structure (see FIG. 5).

Generally epitaxial growth of IBA on m-plane 15R—SiC substrates has been studied. SWBXT and cross-sectional HRTEM revealed non-twinned (353) orientated IBA, with significantly improved macroscopic properties as probed optically. It was found that the choice of film orientation resulted from the tendency to nucleate in (111) IBA orientation on (474) 15R—SiC close-packed facets.

Therefore, the use of m-plane 15R-silicon carbide substrates has been shown to eliminate random variations in the in-plane orientation of epitaxial films. This is an improvement over the conventional substrates, including c-plane (0001) 4H—SiC and c-plane 6H—SiC, upon which films can nucleate with two or more in-plane orientations. The coalescence of regions that nucleate with different orientations on these conventional substrates produces the boundaries between regions of different orientations and the structures of the different regions do not match, resulting in crystalline defects and corresponding electrical defects such as leakage paths and trap levels. Conversely, the m-plane 15R—SiC substrate forms an ordered step and terrace structure that makes it energetically favorable for separately nucleating portions of the epitaxial film to adopt only one crystal orientation. Consequently, regions that originate from different nucleation points have the same orientation, and are able to coalesce without creating defects. The reduction in defects leads to better structural, electrical and optical properties.

4. Application of Terrace and Step-Riser Growth Strategy for Non-Twinned Growth to Other Substrates While improved material quality was experimentally demonstrated for epitaxial films of the specific material $B_{12}As_2$ on m-plane 15R—SiC, other substrates may be used for reducing or eliminating defects in epitaxial films of other materials as well. The principle that makes the approach work is that instead of attempting epitaxial growth on crystalline facets that are very large compared to a lattice constant of the material being grown, the substrate should present (a) terraces of a few (e.g., two to ten) times a lattice constant of the material being grown, and (b) step risers between the terraces that present a step height and offset consistent with a substantial crystalline match between portions of material grown on adjacent terraces, such that such portions grow together naturally into a single crystal lattice. An upper limit of terrace width is related to a size at which multiple crystals of the grown material begin to form, presenting the possibility of degenerate epitaxy and thus defeating the tendency for multiple sites to nucleate in the same orientation. A maximum terrace width being ten times a lattice constant is seen as a general rule of thumb, but individual substrate materials and grown materials may require narrower terraces or may allow wider terraces, respectively, without nucleating material in the wrong orientation. The step height and offset presented by each step riser should be consistent with a substantial crystalline match between portions of material grown on adjacent terraces (for example, such step height and offset might be within about 15% of a height and offset required for a perfect match of the grown material). It is also possible (as shown in the m-plane 15R—SiC example) that periodic variations in the risers mitigate this difference such that over large growths, local strains introduced in the lattice to absorb a mismatch are reduced. Furthermore, the step riser surfaces may energetically favor nucleation of the grown material in a specific orientation, such as the (212) 15R—SiC presents C atoms for bonding to IBA in the non-twinned orientation as opposed to the twinned orientation.

Following these principles, theoretical analysis suggests that an m-plane 15R—SiC substrate may effectively eliminate double positioning boundaries in epitaxial 3C-silicon carbide films, a goal that has eluded researchers for decades. Furthermore, it may be possible to grow double-positioning boundary free gallium nitride (GaN), indium nitride (InN), aluminum nitride (AlN), and their alloys to form semiconductors that are useful for light emitting diodes and laser diodes on silicon carbide substrates. Thin films of other semiconductors, insulators, metals, ferromagnetics, ferroelectrics, superconductors, and other material types may be improved by using this substrate as well. In all cases, this would result in reduced defect densities, improved properties, and improved device performance.

Figure 11:
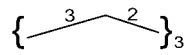
FIG. 11 shows polytype stacking-layer variations of SiC that may be useful as substrates for epitaxial growth, in accord with embodiments.
Figure 11:
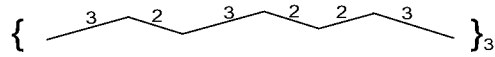
Figure 11:
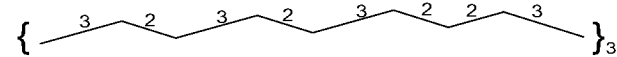
Figure 11:
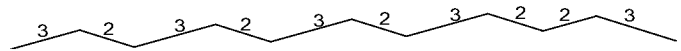
Figure 11:
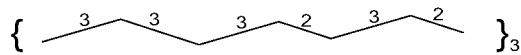
Figure 11:
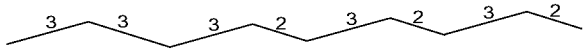
Figure 11:
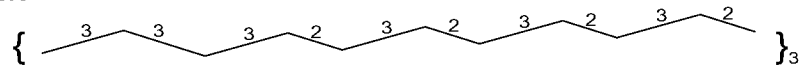
Figure 11:
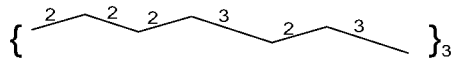
Figure 11:
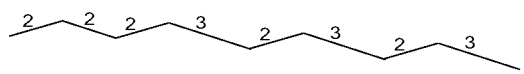
Figure 11:
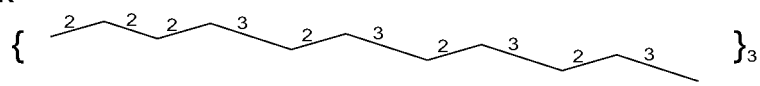

It should also be understood that other materials exist which could be suitable for comprising the substrate of material systems disclosed herein. For example, other polytypes could be used which have the same local structure as 15R—SiC, including 45R—SiC, 60R—SiC, 25H—SiC, 48R—SiC, 21H—SiC, 78R—SiC, 48R—SiC, 21H—SiC, and 78R—SiC. FIG. 11 shows polytype stacking-layer variations of SiC that may be useful as substrates for epitaxial growth, in addition to 15R—SiC; it is understood that other substrate materials that exhibit polytypism may present similar opportunities for substantially matching a material grown thereon. Such materials include but are not limited to zinc sulfide, lead iodide, titanium sulfide and cadmium iodide.

A partial and non-limiting list of possible applications for embodiments herein include uses such as: (i) icosahedral boron arsenide or boron phosphide neutron detectors; (ii) icosahedral boron arsenide or boron phosphide beta or alpha cells for the direct conversion of nuclear energy to electrical energy; (iii) 3C-silicon carbide transistors and diodes, for high power, high frequency, and high temperature operation, in energy production and transmission, transportation (electric vehicles), and communications industries; (iv) 3C—SiC/15R—SiC heterojunction diodes and transistors for high power, high frequency, and high temperature operation, in energy production and transmission, transportation (electric vehicles), and communications industries; (v) silicon carbide metal oxide semiconductor field effect transistors (MOSFETS) based on alternative epitaxial dielectrics such as magnesium oxide; (vi) all silicon carbide devices with applications for high power, high frequency, and high temperature operation, in energy production and transmission, transportation (electric vehicles), radiation resistance (nuclear reactor monitoring and space-based electronics), and communications industries; (vii) m-plane 15R—SiC substrates for a wide variety of epitaxial films including MgO, $TaB_2$, $MgB_2$, $BiFeO_3$, and others; (viii) detectors and sensors; (ix) light emitting laser diodes; and (x) thermoelectric converters. Finally, it is appreciated that products that utilize the material structures disclosed herein may be, but are not necessarily, semiconductor based products.

In addition to the use of different materials and polytypes, use of misoriented (also known as "offcut") substrates also enables manipulation of the relative populations of the multiple variants. For example, studies on offcut (0001) 6H—SiC substrates had before been largely unsuccessful.

Since, it has been discovered by the present inventors that a specific misorientation from the exact crystal plane can produce step risers that produce high quality epitaxial IBA films. Improved material quality has been experimentally verified for IBA films deposited on 4H—SiC substrates tilted by about 7 degrees from the (0 0 0 1) plane in the (1 -1 0 0) direction. Although a 7 degree tilt is preferred in embodiments, it is believed that other tilts may be useful. The density of defects in the IBA films on these substrates was substantially lower than for the cases of IBA on on-axis 6H—SiC substrates (e.g., no substrate misorientation) or for IBA on 4H—SiC or 6H—SiC with misorientation in the (1 -2 0 0) direction (which is an industry standard tilt direction for commercial SiC wafers).

Many different arrangements of the various components depicted, as well as components not shown, are possible without departing from the spirit and scope of the present invention. Embodiments of the present invention have been described with the intent to be illustrative rather than restrictive. Alternative embodiments will become apparent to those skilled in the art that do not depart from its scope. A skilled artisan may develop alternative means of implementing the aforementioned improvements without departing from the scope of the present invention.

It will be understood that certain features and subcombinations are of utility and may be employed without reference to other features and subcombinations and are contemplated within the scope of the claims. Not all steps listed in the various figures need be carried out in the specific order described.

The invention claimed is:

1. A method of epitaxial growth of a material on a crystalline substrate, comprising:
    selecting a substrate having a crystal plane that includes a plurality of terraces with step risers that join adjacent terraces,
    each terrace of said plurality presenting a lattice constant that substantially matches a lattice constant of the material, and
    each step riser presenting a step height and offset consistent with portions of the material nucleating on adjacent terraces being in substantial crystalline match at the step riser;
    preparing the substrate by exposing the crystal plane; and
    epitaxially growing the material on the substrate such that said portions of the material nucleating on adjacent terraces merge into a single crystal lattice.

2. The method of claim 1, further comprising annealing the substrate in a hydrogen ambient between the steps of preparing the substrate and epitaxially growing the material.

3. The method of claim 1, wherein selecting the substrate comprises identifying an m-plane of the substrate.

4. The method of claim 1, wherein selecting the substrate comprises identifying the crystal plane as presenting the terraces as having widths between two and ten times the lattice constant of the material.

5. The method of claim 1, wherein selecting the substrate comprises identifying the step risers as energetically favoring nucleation in a single crystal orientation.

6. The method of claim 1, wherein selecting the substrate further comprises selecting one of silicon carbide, zinc oxide, zinc sulfide, gallium nitride, aluminum nitride, titanium sulfide and cadmium iodide as a material of the substrate.

7. The method of claim 6, wherein selecting the substrate further comprises selecting silicon carbide as the material of the substrate and the crystal plane as one of a 15R surface, a 45R surface, a 48R surface, a 60R surface, a 78R surface, a 21H surface and a 25H surface.

8. The method of claim 6, wherein selecting the substrate comprises selecting silicon carbide as the material of the substrate and preparing the substrate comprises exposing the crystal plane as a surface that is offcut from the (0 0 0 1) plane in the (1-1 0 0) direction.

9. The method of claim 8, wherein preparing the substrate comprises exposing the crystal plane as a surface that is offcut in a range from almost 7 degrees in the (1-1 0 0) direction.

10. The method of claim 9, wherein preparing the substrate comprises exposing the crystal plane as a surface that is offcut in a range from about 7 degrees in the (1-1 0 0) direction.

11. The method of claim 1, wherein epitaxially growing the material comprises growing one of icosahedral boron arsenide, silicon carbide, gallium nitride, aluminum nitride, magnesium oxide, tantalum boride, magnesium boride and bismuth iron oxide.

12. A material structure comprising:
    a substrate and an epitaxially grown material thereon;
    the substrate forming a crystal plane that includes a plurality of terraces with step risers that join adjacent terraces, wherein said crystal plane comprises
    a first terrace and a second terrace; and
    a step riser between the first and second terraces, each of the first and second terraces presenting a lattice constant that substantially matches a lattice constant of the epitaxially grown material;
    and wherein each step riser presenting a step height and offset consistent with portions of the epitaxially grown material that nucleate on adjacent terraces being in substantial crystalline match at the step riser; and
    the epitaxially grown material forming said portions as a single crystal lattice upon each terrace and joining as a single crystal over the step risers.

13. The material structure of claim 12, the epitaxially grown material being disposed adjacent to an m-plane of the substrate.

14. The material structure of claim 12, the terraces having widths between two and ten times the lattice constant of the material.

15. The material structure of claim 12, the substrate comprising one of silicon carbide, zinc oxide, zinc sulfide, gallium nitride, aluminum nitride, titanium sulfide and cadmium iodide.

16. The material structure of claim 15, the substrate comprising silicon carbide, the crystal plane comprising one of a 15R surface, a 45R surface, a 48R surface, a 60R surface, a 78R surface, a 21H surface and a 25H surface.

17. The material structure of claim 12, the epitaxially grown material comprising one of icosahedral boron arsenide, silicon carbide, gallium nitride, aluminum nitride, magnesium oxide, tantalum boride, magnesium boride and bismuth iron oxide.

18. The material structure of claim 17 wherein the epitaxially grown material of the substrate exposes the crystal plane as a surface that is offcut from the (0 0 0 1) plane in the (1-1 0 0) direction.

19. The material structure of claim 18 wherein the crystal plane is offcut in the range of almost 7 degrees in the (1-1 0 0) direction.

20. The material structure of claim 18 wherein the crystal plane is offcut by about 7 degrees in the (1-1 0 0) direction.

* * * * *